United States Patent [19]

King

[11] Patent Number: 5,796,158
[45] Date of Patent: *Aug. 18, 1998

[54] LEAD FRAME COINING FOR SEMICONDUCTOR DEVICES

[75] Inventor: Jerrold L. King, Boise, Id.

[73] Assignee: Micron Technology, Inc., Boise, Id.

[*] Notice: The term of this patent shall not extend beyond the expiration date of Pat. No. 5,466,639.

[21] Appl. No.: 509,216

[22] Filed: Jul. 31, 1995

[51] Int. Cl.$^6$ .................................................. H01L 23/495
[52] U.S. Cl. ........................ 257/666; 257/676; 257/692; 257/775
[58] Field of Search ........................ 257/775, 666, 257/676, 692

[56] References Cited

U.S. PATENT DOCUMENTS

| | | | |
|---|---|---|---|
| 4,205,548 | 6/1980 | Bothner et al. | 72/404 |
| 5,256,598 | 10/1993 | Farnworth et al. | 437/220 |
| 5,286,342 | 2/1994 | Tsuji | 257/666 |
| 5,304,842 | 4/1994 | Farnworth et al. | 257/668 |
| 5,343,616 | 9/1994 | Roberts | 29/846 |
| 5,357,139 | 10/1994 | Yaguchi et al. | 257/676 |
| 5,358,906 | 10/1994 | Lee | 257/666 |
| 5,451,813 | 9/1995 | Kazutaka | 257/676 |
| 5,457,071 | 10/1995 | Dombroski | 437/217 |

FOREIGN PATENT DOCUMENTS

| | | | |
|---|---|---|---|
| 120765 | 4/1992 | Japan | 257/775 |
| 5-308092 | 11/1993 | Japan | 257/666 |

*Primary Examiner*—Tom Thomas
*Assistant Examiner*—Roy Potter

[57] ABSTRACT

A semiconductor device comprises a semiconductor die having a circuit side and a lead frame having a plurality of lead fingers. Each of the lead fingers comprises a first side having a generally planar first portion which overlies the die and a second side having a first surface and a second surface discontinuous or noncoplanar with the first surface. The circuit side of the die is attached to the second surface. The first side, the first surface and the second surface have generally parallel planes. A distance through each finger from the first side to the first surface is greater than a second distance through the finger from the first side to the second surface.

27 Claims, 2 Drawing Sheets

LEAD FRAME COINING FOR SEMICONDUCTOR DEVICES

FIELD OF THE INVENTION

This invention relates to the field of semiconductor manufacture, and more particularly to a type of semiconductor assembly having a wafer section supported by a lead frame.

BACKGROUND OF THE INVENTION

To form a lead frame for an encapsulated semiconductor device the lead frame is mechanically stamped or chemically etched from a piece of metal such as copper or copper alloy. During stamping, the edges of the metal, for example the metal around lead fingers, can become burred, rounded, and otherwise misformed due to tearing or shearing of the metal. This can make attachment of a bond wire to a lead finger less reliable and more difficult than with a properly shaped, flat and nonburred lead finger.

To reduce the problems associated with burred, rounded, and narrow lead fingers, a lead frame can be coined at the lead fingers in the area where a bond wire is to be connected. This effectively flattens and widens the tips of the lead finger to provide a flat surface for the connection of the bond wire. Coining allows for a decreased pitch with etched lead frames as it widens the bonding surface, and is therefore desirable with etched lead frames as well. With a leads-over-chip (LOC) assembly, the side of the lead finger opposite the coining is connected to a circuit side of the semiconductor die, then the bond wires are formed to electrically couple the semiconductor die with the lead fingers.

Coining the lead fingers, however, can create various problems. As a result of the tips of the lead fingers being coined, a step-like discontinuity is created on the surface to which the bond wire is to be attached. The bond wire must be carefully positioned so as to avoid placing the bond at this discontinuity, which would result in a weak attachment of the bond wire to the lead finger.

A semiconductor assembly which avoids problems associated with coined lead frames of previous designs would be advantageous.

SUMMARY OF THE INVENTION

An embodiment of the inventive semiconductor device comprises a wafer section such as a semiconductor die or a plurality of singularized or unsingularized die. The embodiment of the invention further comprises a wafer section support such as a lead frame having at least one lead finger. The lead finger comprises a generally planar first side, and a second side having a first surface and a second surface discontinuous or noncoplanar with the first surface, with the wafer section attached to the second surface. In this inventive embodiment, a first distance through the finger from the first side to the first surface is greater than a second distance through the finger from the first side to the second surface.

Objects and advantages will become apparent to those skilled in the art from the following detailed description read in conjunction with the appended claims and the attached drawings.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
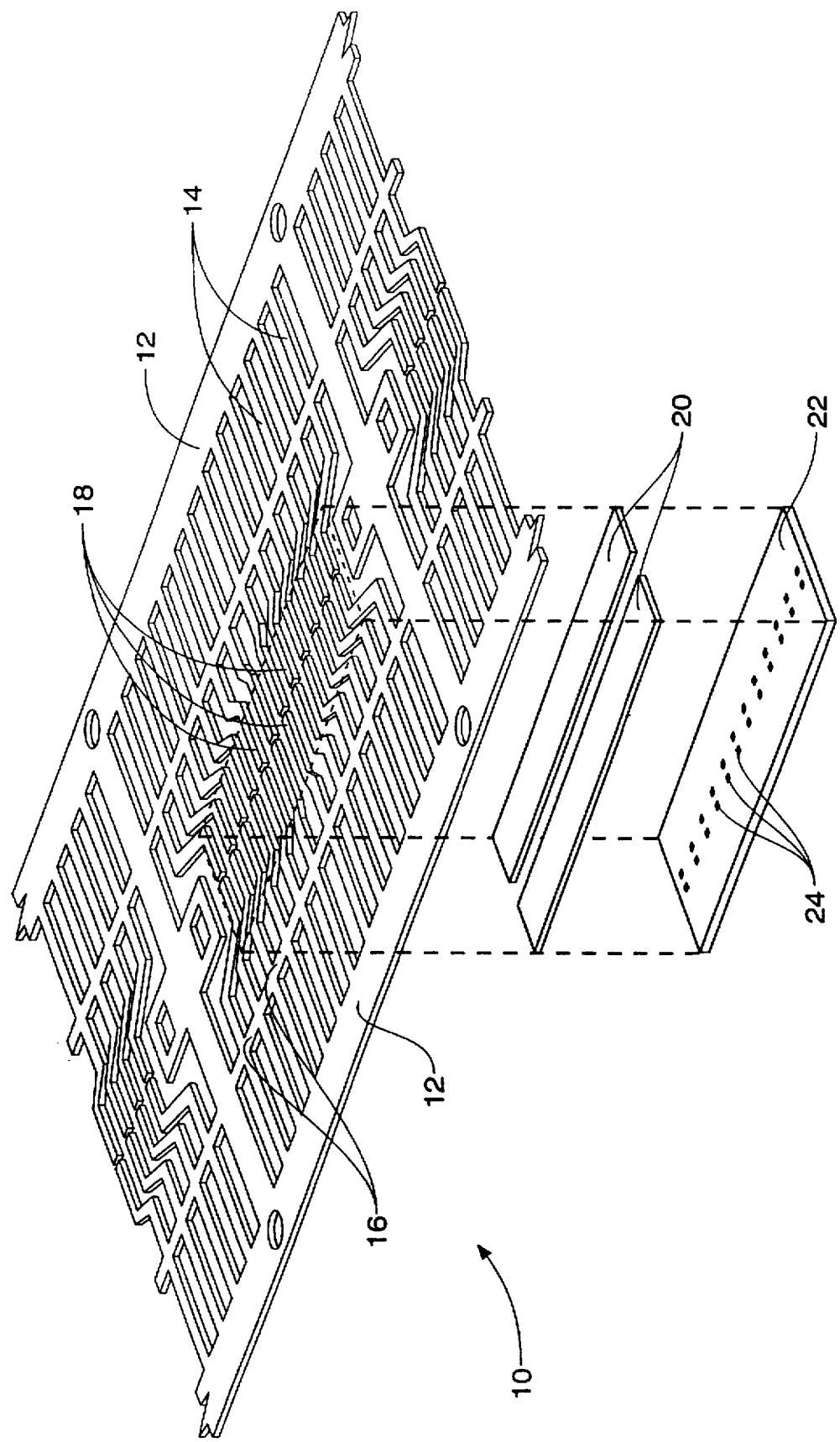
FIG. 1 is an axonometric view of a leads-over-chip semiconductor assembly.

FIG. 1 depicts a view of a leads-over-chip (LOC) semiconductor assembly comprising a lead frame 10 having a pair of lead frame rails 12, leads 14, dam bars 16, and lead fingers 18. An attachment 20 connects the lead frame 10 with a wafer section 22 such as a die. In an LOC configuration, a circuit side of the wafer section (the side with circuitry thereon) is connected to the lead frame. The assembly further comprises bond wires (not depicted) which electrically connect bond pads 24 on the die 22 with the lead fingers 18.

Figure 2:
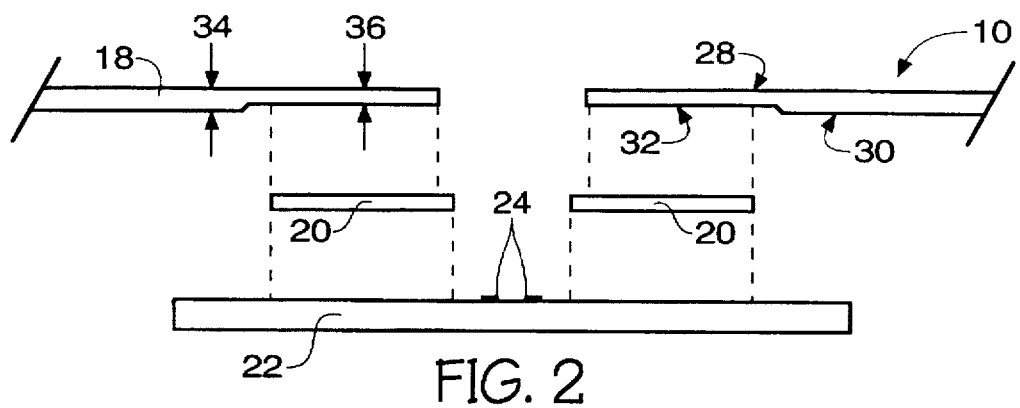
FIG. 2 is an exploded fractional cross section of a first embodiment of the invention.
Figure 3:
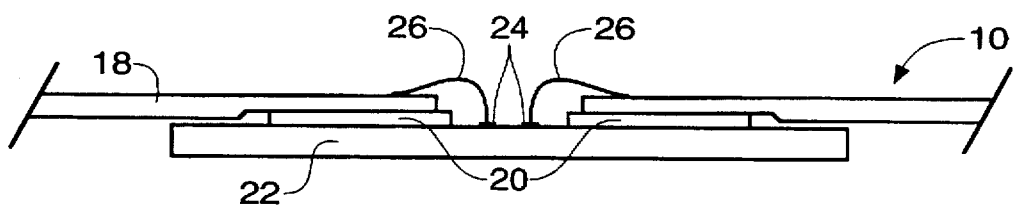
FIG. 3 is a fractional cross section of the FIG. 2 embodiment of the invention with the addition of bond wires.

FIG. 2 is an exploded fractional cross section of a first embodiment of the invention depicting in detail the structure in the area of the wafer section 22 and lead fingers 18. FIG. 3 is a fractional cross section of the FIG. 2 embodiment of the invention with the addition of bond wires 26. With the FIG. 2 and 3 embodiment, the lead fingers 18 of a wafer section support such as a lead frame 10 comprise a generally planar first side 28 to which the bond wire 26 will be connected. The lead finger further comprises a second side having a first surface 30 and a second surface 32 discontinuous or noncoplanar with the first surface 30. The discontinuity between the first and second surfaces of the second side, which is formed during a coining process of the lead finger, can be any number of discontinuties depending on the coining. The wafer section 22 is attached to the second surface 32 with an adhesive material 20, for example with a tape material. In this embodiment, a first distance 34 through the finger from the first side to the first surface is greater than a second distance 36 through the finger from the first side to the second surface.

With the FIG. 3 embodiment the first and second surfaces both overlie the wafer section. To keep the first surface 30 of the second side from contacting the wafer section 22 the first 30 and second 32 surfaces have generally parallel planes. In most embodiments, these two planes will be generally parallel with the plane of the first side 28. The distance between the die and the first surface of the lead frame is generally a minimum distance. This provides clearance to reduce the liklihood of the lead frame shorting out circuitry on the die and also enables encapsulation material to be forced into the gap between the two elements with an encapsulated package. This distance is a function of the adhesive material thickness and the depth of the coin.

Figure 4:
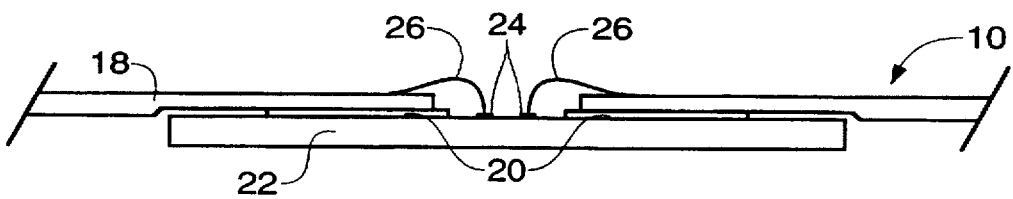
FIG. 4 is a fractional cross section of a second embodiment of the invention.

The embodiment of FIG. 4 differs from the FIG. 3 embodiment, for example as the first surface of the second side does not overlie the wafer section. This allows the adhesive material, for example a tape, to be thinner than with the FIG. 3 embodiment and may therefore allow for a thinner package. With this embodiment, the distance between the wafer section and the second surface of the second side is a minimum distance and is a function of the adheasinve thickness.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the various embodiments of the invention can be used to attach a semiconductor die or other wafer section to a lead frame other than the LOC style lead frame shown, various adhesives can be used, and other embodiments of the invention will become apparent to those skilled in the art from reading this description. It is therefore contemplated that the appended claims will cover any such modifications or embodiments as fall within the true scope of the invention.

I claim:

1. A semiconductor device comprising:

a wafer section; and a wafer section support having at least one lead finger, said lead finger comprising a generally planar first side and a second side having a first surface and a second surface noncoplanar with said first surface, said wafer section being attached to said second surface, wherein a first distance through said finger from said first side to said first surface is greater than a second distance through said finger from said first side to said second surface and said second surface overlies said die.

2. The semiconductor device of claim 1 further comprising a bond wire attached to said first side and said wafer section.

3. The semiconductor device of claim 1 wherein said first surface overlies said wafer section.

4. The semiconductor device of claim 1 wherein said first surface and said second surface have generally parallel planes.

5. The semiconductor device of claim 1 wherein said first surface, said second surface, and said first side have generally parallel planes.

6. The semiconductor device of claim 1 wherein said wafer section is a semiconductor die and said wafer section support is a lead frame.

7. The semiconductor device of claim 1 further comprising an adhesive which attaches said wafer section to said second surface.

8. The semiconductor device of claim 1 wherein said wafer section comprises a plurality of bond pads and said wafer section support comprises a plurality of fingers wherein none of said fingers overlie any of said bond pads.

9. The device of claim 1 wherein said first surface is at least partially encapsulated.

10. A leads-over-chip semiconductor device assembly comprising:

a wafer section having a side with circuitry thereon;

a wafer section support having a plurality of lead fingers, each said lead finger comprising a first side having a generally planar first portion which overlies said wafer section and a second side having a first surface and a second surface noncoplanar with said first surface, said wafer section being attached to said second surface, wherein a first distance through said finger from said first side to said first surface is greater than a second distance through said finger from said first side to said second surface.

11. The semiconductor device of claim 10 wherein said circuit side of said wafer section is attached to said second surface.

12. The semiconductor device of claim 10 further comprising a bond wire attached to said first side and said wafer section.

13. The semiconductor device of claim 8 wherein said first surface and said second surface have generally parallel planes.

14. The semiconductor device of claim 10 wherein said first surface, said second surface, and said first side have generally parallel planes.

15. The semiconductor device of claim 10 wherein said wafer section is a semiconductor die and said wafer section support is a lead frame.

16. The semiconductor device of claim 10 further comprising an adhesive which attaches said wafer section to said second surface.

17. The semiconductor device of claim 10 wherein said first surface and said second surface overlie said wafer section.

18. The device of claim 10 wherein said first surface is at least partially encapsulated.

19. A semiconductor device comprising:

a semiconductor die having a circuit side;

a lead frame having a plurality of lead fingers, each said lead finger comprising a first side having a generally planar first portion which overlies said die and a second side having a first surface and a second surface noncoplanar with said first surface, said circuit side of said die being attached to said second surface, said first side, said first surface, and said second surface having generally parallel planes, wherein a first distance through said finger from said first side to said first surface is greater than a second distance through said finger from said first side to said second surface; and a bond wire attached to said first side and said die.

20. The semiconductor device of claim 19 further comprising an adhesive which attaches said die to said second surface.

21. The semiconductor device of claim 19 wherein said first surface and said second surface overlie said die.

22. The device of claim 19 wherein said first surface is at least partially encapsulated.

23. A semiconductor device comprising:

a wafer section;

a wafer section support having a plurality of lead fingers each comprising a first portion and a second portion each having a thickness wherein said thickness of said first portion is greater than said thickness of said second portion, wherein said second portions are cooperatively formed to define a recess to receive an adhesive which connects said wafer section with said plurality of lead fingers.

24. The semiconductor device of claim 23 wherein said second portion of each said lead finger overlies said wafer section.

25. The semiconductor device of claim 23 wherein said recess receives said wafer section.

26. The device of claim 23 wherein said first and second portions of each said lead finger overlie said wafer section.

27. The device of claim 23 wherein said first portion is at least partially encapsulated.

* * * * *